(12) United States Patent
Lin

(10) Patent No.: US 6,477,049 B1
(45) Date of Patent: Nov. 5, 2002

(54) FIXTURE ASSEMBLY FOR A HEAT SINK

(76) Inventor: Jen-Cheng Lin, 9 Fl., No. 786, Chung-Cheng Rd., Chung-Ho City, Taipei Hsien (TW)

( * ) Notice: Subject to any disclaimer, the term of this patent is extended or adjusted under 35 U.S.C. 154(b) by 0 days.

(21) Appl. No.: 09/864,707

(22) Filed: May 23, 2001

(51) Int. Cl.$^7$ .................................................. H05K 7/20
(52) U.S. Cl. ......................... 361/704; 24/458; 24/573; 165/80.3; 165/185; 257/719; 361/710
(58) Field of Search ........................ 24/457–458, 573; 165/80.2, 80.3, 185; 174/16.3; 257/718–719, 726–727; 361/690, 704, 707, 709–710, 715, 719–721

(56) References Cited

U.S. PATENT DOCUMENTS

| | | | | |
|---|---|---|---|---|
| 5,323,845 A | * | 6/1994 | Kin-shon | 165/80.3 |
| 5,493,475 A | * | 2/1996 | Lin | 361/710 |
| 6,061,239 A | * | 5/2000 | Blomquist | 361/704 |
| 6,181,559 B1 | * | 1/2001 | Seo | 361/704 |
| 6,343,017 B1 | * | 1/2002 | Yu et al. | 361/704 |

* cited by examiner

*Primary Examiner*—Gregory Thompson
(74) *Attorney, Agent, or Firm*—Alan D. Kamrath; Rider, Bennett, Egan & Arundel

(57) ABSTRACT

A heat sink with a fixture assembly has two flanges respectively formed at two opposite sides of the heat sink, a fixing unit secured on a main board at opposite sides of a CPU, a hold-down unit including two holders respectively pivoted at the opposite sides of the heat sink, and a shift unit having two shift levers respectively connected with the holders. The heat sink is easily assembled on the CPU after holding pawls of the holders are respectively caught with corresponding hooks of the fixing unit, and the shift levers are turned to a locking position in which the heat sink is securely fixed with the fixing unit and tightly abutted against an upper surface of the CPU.

20 Claims, 7 Drawing Sheets

FIXTURE ASSEMBLY FOR A HEAT SINK

BACKGROUND OF THE INVENTION

1. Field of the Invention

The present invention relates to a fixture assembly of a heat sink. With such a fixture assembly, the user easily fixes the heat sink on a CPU and can force the heat sink to tightly abut against an upper surface of the CPU.

2. Deception of Related Art

Due to continuing development of the speed of the CPU, various heat sinks are designed to meet heat dissipation requirements of the CPU, Presently, the technology of the updated heat sinks tends to be sophisticated. However, conventional methods of fixing the heat sink on a CPU still have some drawbacks to overcome.

Even when the heat sink is securely fixed on a CPU, a conducting plate of the heat sink may not be tightly abutted against the CPU, and thus a space apparent or unexpected exists between the heat sink and the CPU. It can be appreciated that this space existing between the heat sink and the CPU is certainly undesirable, because a lowering of conductivity must be caused by this space. Furthermore, this undesirable space existing between the heat sink and the CPU is difficult to obviate by the present techniques in manufacturing of the heat sinks.

Therefore, it is an objective of the invention to provide a heat sink with an improved fixture assembly to mitigate and/or obviate the aforementioned problems.

SUMMARY OF THE INVENTION

The main object of the present invention is to provide a heat sink with a fixture assembly. The heat sink has a plurality of fins integrally formed on a conducting plate. Two flanges are respectively formed at two opposite sides of the conducting plate. A fixing unit is secured on a main board at opposite sides of a CPU, and has two pairs of hooks respectively formed at two opposite ends of two opposite sides thereof. A hold-down unit includes two holders respectively pivoted at the opposite sides of the heat sink and two pairs of holding pawls corresponding to the two pairs of hooks of the fixing unit. A shift unit has two shift levers respectively connected with the holders and pivotally extended in a direction perpendicular to the pivotal direction of the holders. The shift lever is an L-shaped member having a pressing end, a thumb grip end and a pivot hole defined in the middle thereof between the pressing end and the thumb grip end. Whereby the heat sink is easily fixed on the CPU, after the holding pawls are respectively caught with the hooks of the fixing unit, and the shift levers are turned to a position in which the heat sink is securely fixed with the fixing unit and tightly abutted against an upper surface of the CPU.

Other objects, advantages and novel features of the invention will become more apparent from the following detailed description when taken in conjunction with the accompanying drawings.

DETAILED DESCRIPTION OF THE PREFERRED EMBODIMENT

Figure 1:
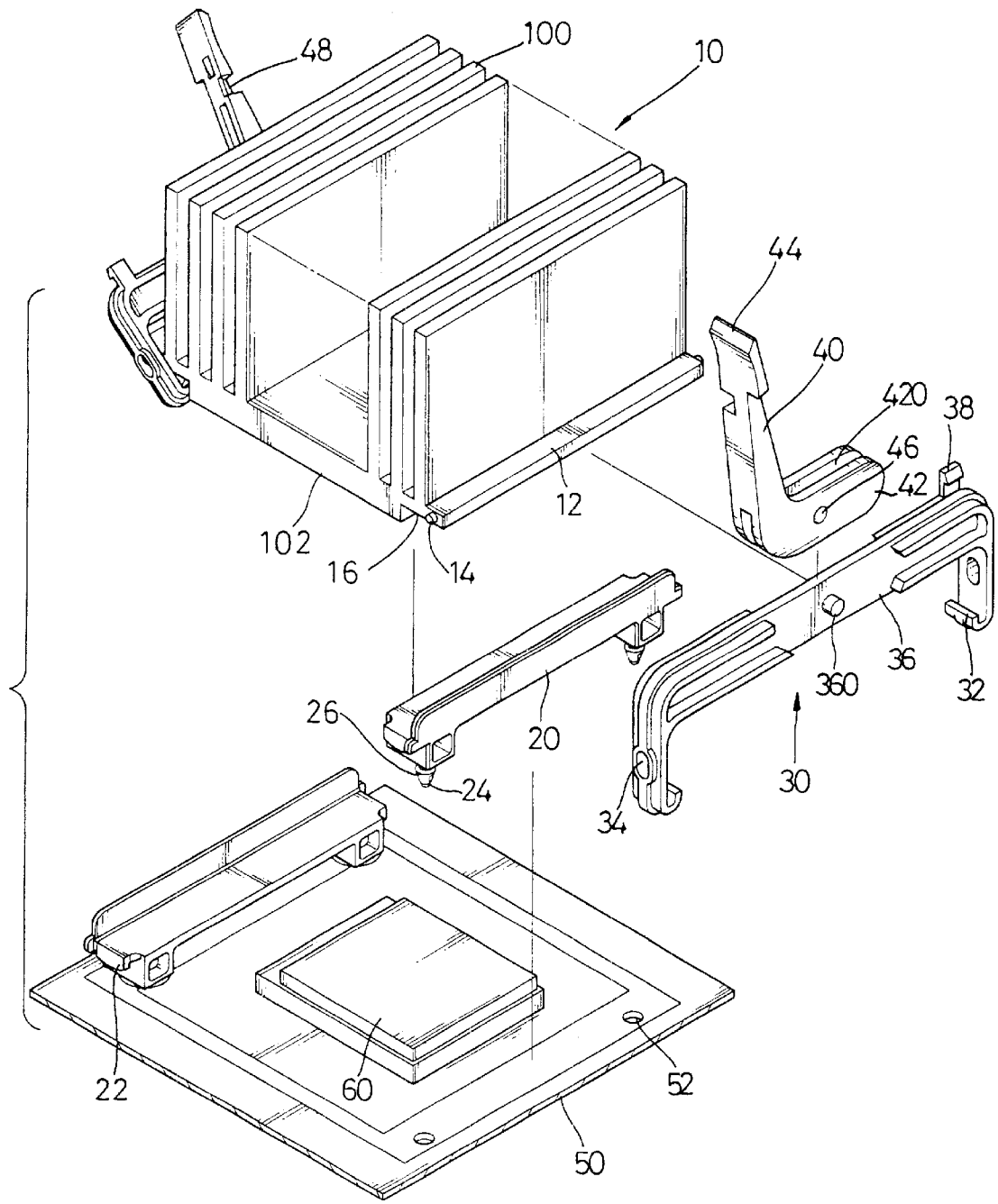
FIG. 1 is an exploded perspective view of a heat sink with a fixture assembly in accordance with the invention.

As shown in FIG. 1, a heat sink (10) with a fixture assembly according to the invention comprises the heat sink (10), a fixing unit, a hold-down unit and a shift unit.

The heat sink (10) has a plurality of fins (100) integrally formed on an upper surface of a conducting plate (102), and two flanges (12) respectively formed at two opposite sides of the conducting plate (102). Each one of the flanges (12) has two pivot barrels (14) respectively formed at two opposite ends thereof, and a recess (16) defined in a bottom thereof.

The fixing unit includes a pair of fixing seats (20) respectively secured on a main board (50) and at opposite sides of a CPU (60). Each fixing seat (20) has a pair of hooks (22) formed at two opposite ends thereof, and two fixing legs (24) extending downward from a bottom thereof. Each fixing leg (24) has a retaining ring (26) formed there around. The main board (50) is therein defined with two pairs of fixing holes (52) at opposite sides of the CPU (60) corresponding to the fixing legs (24) of the two fixing seats (20). Whereby the fixing seats (20) are respectively secured on the main board (50) by means of the fixing legs (24) respectively inserted into the fixing holes (52) and retained in the fixing holes (52) by the retaining rings (26).

The hold-down unit includes a pair of holders (30) respectively and pivotally connected at the two opposite sides of the heat sink (10). Each holder (30) is formed as an inverted U-shaped member having two holding pawls (32) integrally formed at two lower ends thereof corresponding to the two hooks (22) of the fixing seat (20), and two slots (34) respectively defined at two opposite sides thereof corresponding to the pivot barrels (14) of the heat sink (10). Whereby the holders (30) are respectively connected at the two opposite sides of the heat sink (10) by means of the pivot barrels (14) respectively extended through the slots (34) of the holder (30). A middle portion (36) of the holder (30) has two pivot pins (360) symmetrically formed at the center of two opposite sides thereof and extending perpendicular therefrom. The holder (30) further has a clasp (38) formed at one side of an upper end thereof.

The shift unit includes a pair of shift levers (40) respectively and pivotally connected with the two holders (30). Each shift lever (40) is formed as an L-shaped member having a pressing end (42) and a thumb grip end (44). The pressing end (42) is a rounded end having a gap (420) defined in a center thereof to receive the middle portion (36) of the holder (30) fitted therein. A pivot hole (46) is defined in a middle of the shift lever (40) between the pressing end (42) and the thumb grip end (44) corresponding to the pivot pins (360) of the holder (30). The thumb grip end (44) of the shift lever (40) has a cut (48) defined therein corresponding to the clasp (38) of the holder (30).

Figure 2:
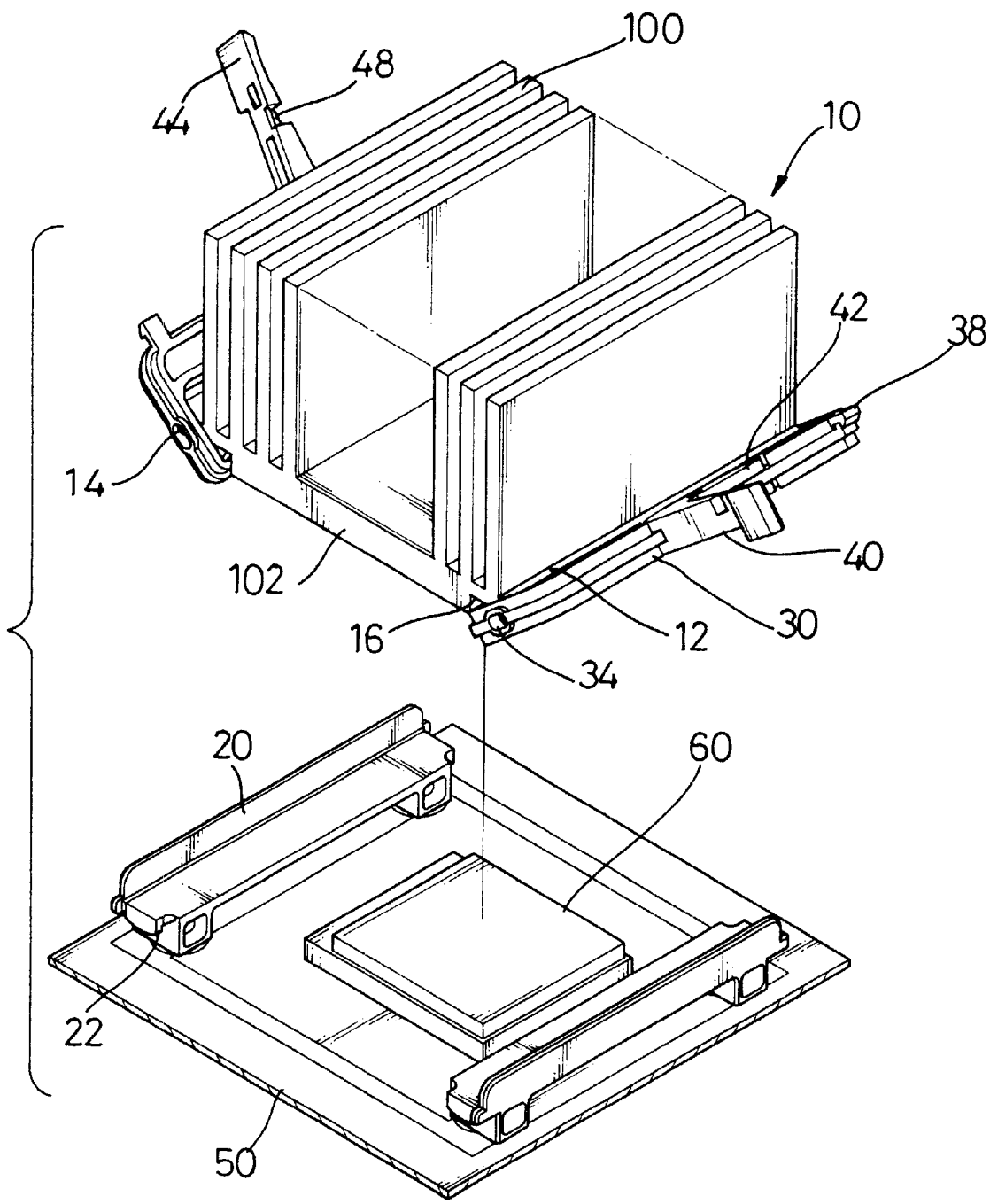
FIG. 2 is a perspective view of the heat sink with the fixture in accordance with the invention, showing a state of the heat sink being not fixed on the CPU.

Now with further reference to FIGS. 1 and 2, before assembling the heat sink (10) on the main board (50), the middle portions (36) of the holders (30) are respectively extended through the gap (420) of the shift lever (40), the shift levers (40) are respectively pivoted with the holders (30) by means of the pivot pins (360) respectively fitted into the corresponding pivot holes (46) of the shift levers (40), and the holders (30) are respectively pivoted at the two opposite sides of the heat sink (10) by means of the pivot barrels (14) respectively fitted into the corresponding slots (34) of the holder (30), whereby the shift levers (40) are pivotal along a direction perpendicular to a pivotal direction of the holders (30) connected with the heat sink (10).

Figure 3:
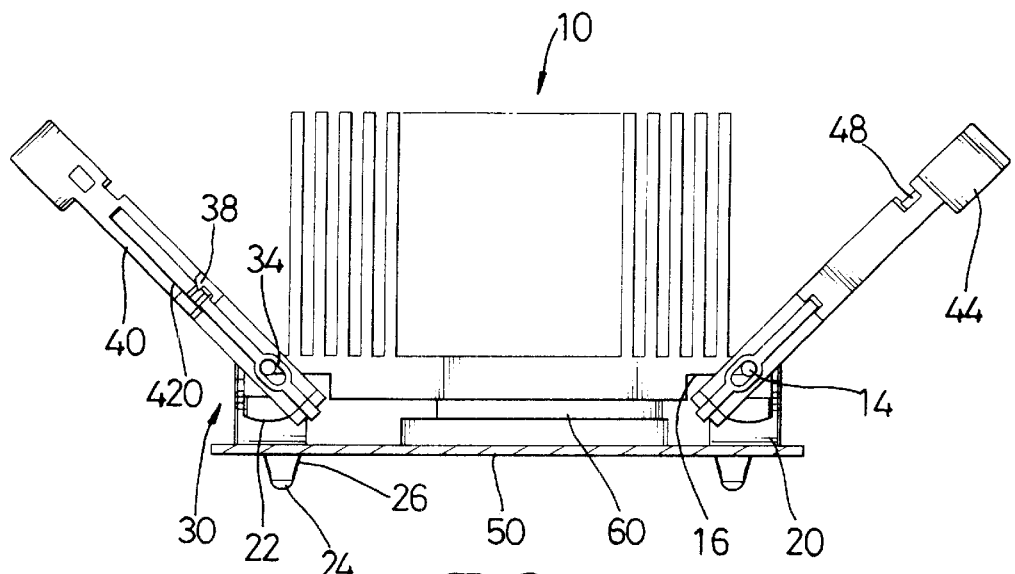
FIGS. 3 to 5 are schematic plan views of the heat sink with the fixture assembly in accordance with the invention, showing an operation of assembling the heat sink on the CPU.
Figure 4:
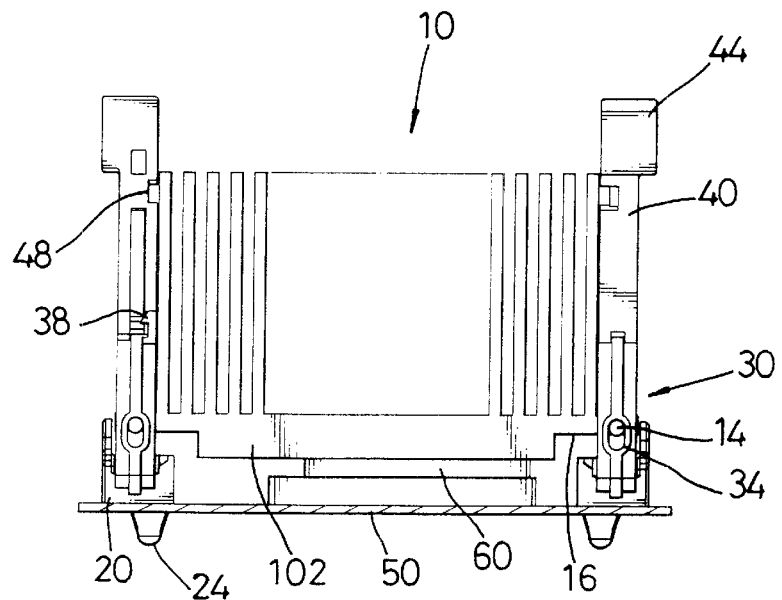
Figure 5:
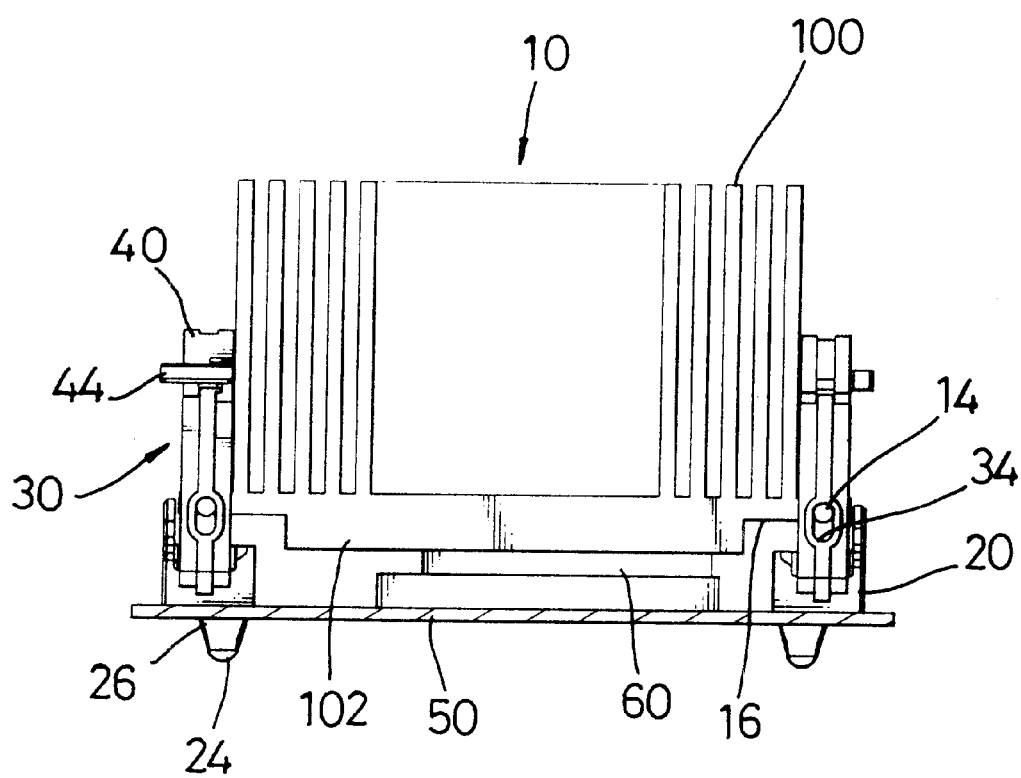

To fix the heat sink (10) with the main board (50) on the CPU (60), first, the holders (30) are respectively turned outward to a position as shown in FIG. 3, and the lower ends of the holders (40) are respectively received in the recesses (16) of the heat sink (10). Then, the heat sink (10) is placed on an upper surface of the CPU (60). Second, the holders (40) are respectively turned inward to a vertical position as shown in FIG. 4, and the holding pawls (32) of the holders (30) are respectively caught with the corresponding hooks (22) of the fixing seats (20). Afterwards, the shift levers (40) are respectively turned to a locking position as shown in FIG. 5. In this locking position, the pressing ends (42) of the shift levers (40) are respectively pressed against the corresponding flanges (12) of the heat sink (10) to cause a deformation of the middle portion (36) of the holders (30). Therefore, by a downward resilient force of the now-deformed holders (30), the conducting plate (102) of the heat sink (10) is tightly abutted against the upper surface of the CPU (60). When the shift levers (40) are turned to the locking position as shown in FIGS. 5 and 7, the shift levers (40) are respectively locked with the holders (30) by means of the clasps (38) being locked with the corresponding cuts (48) of the shift levers (40).

Figure 6:
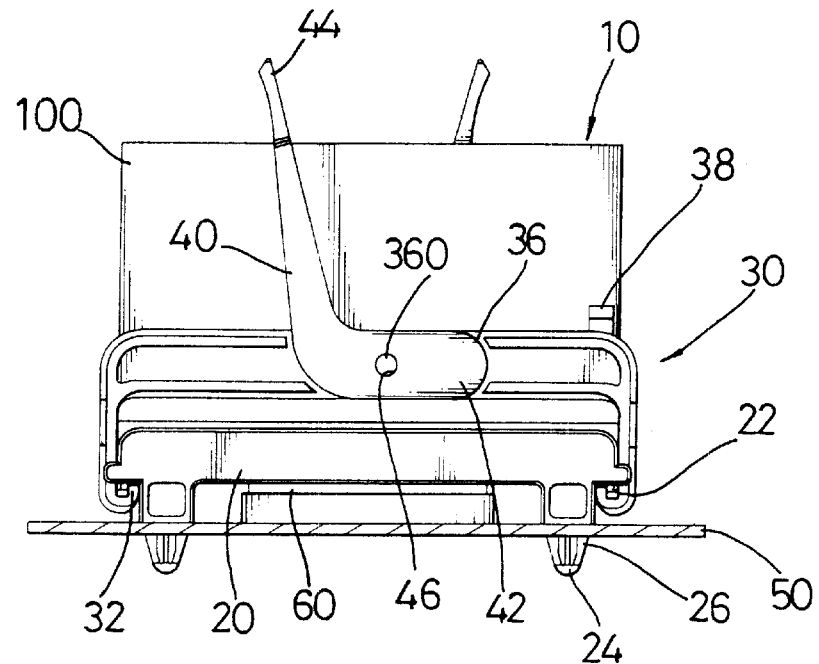
FIGS. 6 and 7 are schematic side views of the heat sink with the fixture assembly in accordance with the invention, showing the operation of assembling the heat sink on the CPU.
Figure 7:
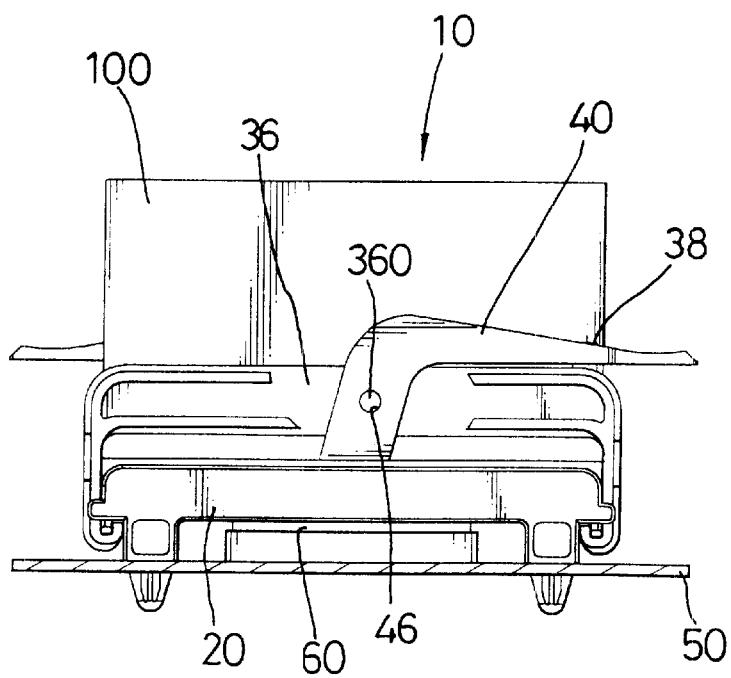

FIGS. 6 and 7 are side views of the operation of fixing the heat sink (10) with the main board (50) on the CPU (60).

Figure 8:
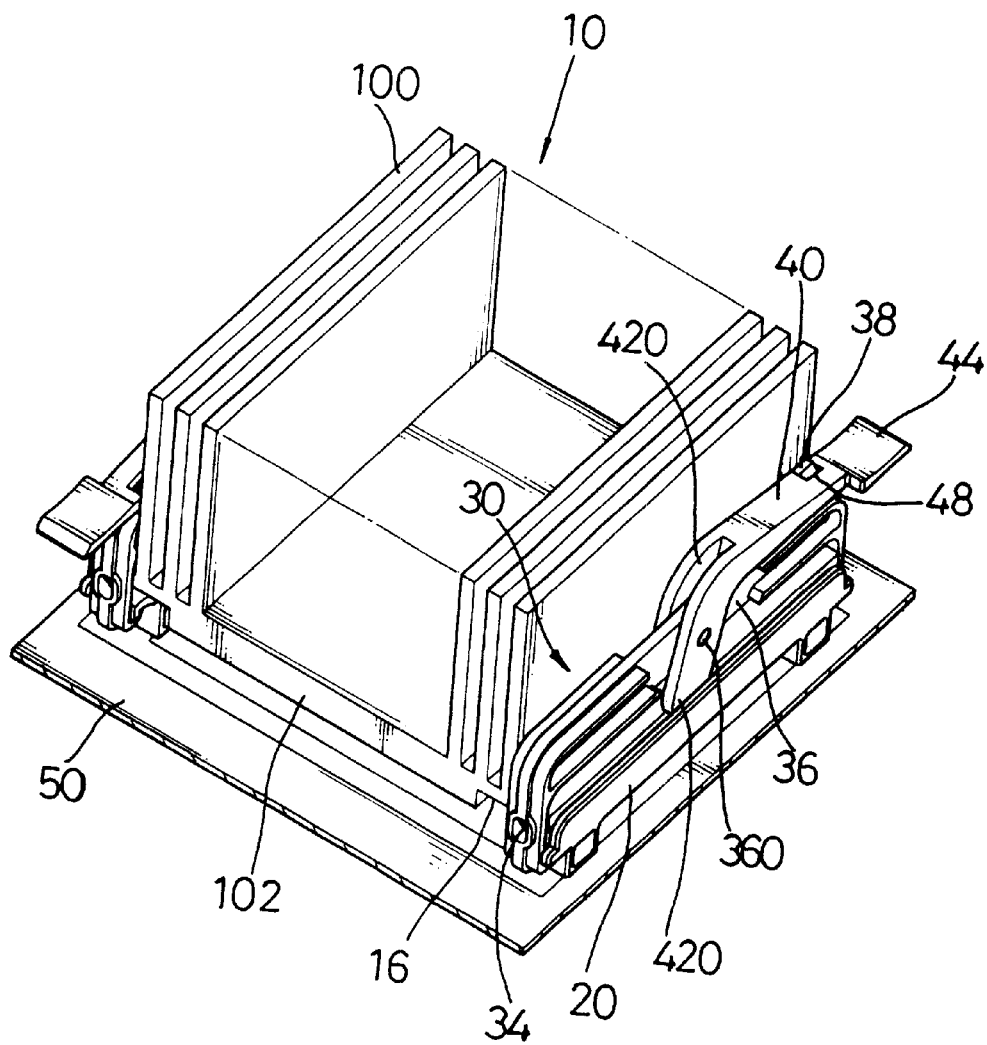
FIG. 8 is a perspective view of the heat sink with the fixture assembly in accordance with the invention, showing a state of the heat sink being fixed on the CPU.

FIG. 8 shows a perspective view of the heat sink (10) being assembled on the main board (50).

Figure 9:
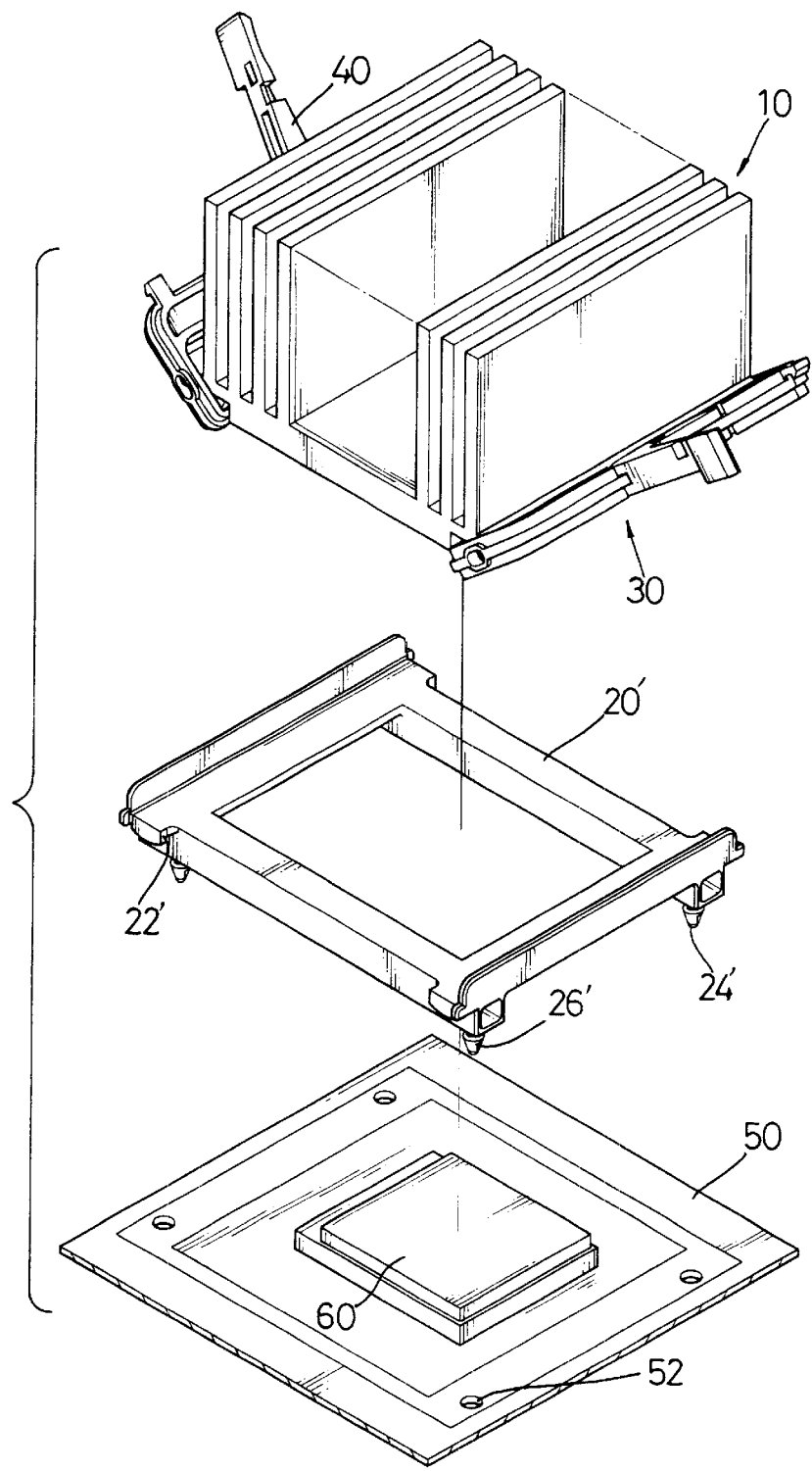
FIG. 9 is an exploded perspective view of another embodiment of the fixture assembly of the heat sink in accordance with the invention.

As shown in FIG. 9, a second practicable embodiment of the invention comprises a fixing unit formed as a framework fixing seat (20') having two pairs of hooks (22') integrally formed at two opposite sides thereof corresponding to the holding pawls (32) of the holders (30), and two pairs of fixing legs (24') extending downward from a bottom thereof corresponding to the fixing holes (52) defined in the main board (50).

The heat sink (10) is easily assembled with the fixing seat (20') secured on the main board (50), and locked with the fixing seat (20') by turning the shift levers (40) into a locking position, so that the bottom of the heat sink (10) is tightly abutted against the upper surface of the CPU (60) to ensure very effective thermal conductivity from the CPU (60) to the heat sink (10).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fixture assembly comprising:

a heat sink;

at least a first fixing unit securable on a main board, with the at least first fixing unit having at least a first pair of hooks formed at two opposite ends thereof; and a hold-down unit for each pair of hooks, with each hold-down unit having a U-shaped holder pivotally connected at two opposite sides of the heat sink in a pivot direction, with the U-shaped holder having two lower ends formed with two holding pawls corresponding to the pair of hooks of the fixing unit;

with the hold-down unit having a shift lever connected with the U-shaped holder and pivotal in a direction perpendicular to the pivotal direction of the U-shaped holder, with the shift lever having a pressing end and a thumb grip end;

whereby when the heat sink is assembled on the main board, the holding pawls of the U-shaped holder catch with the pair of hooks of the fixing unit, and the shift lever is turned to a locking position, in which the pressing end of the shift lever is pressed against the heat sink so as to force the heat sink to abut tightly against a CPU mounted on the main board.

2. The fixture assembly as claimed in claim 1, wherein the heat sink has a plurality of fins integrally formed on a conducting plate, with the heat sink having two flanges formed at two opposite sides thereof, each flange having two pivot barrels respectively formed at two opposite ends thereof corresponding to two slots respectively defined at two opposite sides of the U-shaped holder, with the U-shaped holder being pivotally connected to the heat sink by the two pivot barrels being received in the two slots, and each flange having a recess defined in a bottom thereof to correspond to the holding pawls of the U-shaped holder.

3. The fixture assembly as claimed in claim 1, wherein the at least first fixing unit has at least a first pair of fixing legs extending downward from a bottom thereof corresponding to fixing holes defined in the main board at the opposite sides of the CPU, each fixing leg having a retaining ring formed there around.

4. The fixture assembly as claimed in claim 1, wherein the U-shaped holder has two pivot pins formed at two opposite sides of a middle portion thereof corresponding to a pivot hole defined in a middle of the shift lever between the pressing end and the thumb grip end of the shift lever, the pressing end of the shift lever being defined with a gap to receive the middle portion of the U-shaped holder fitted therein, whereby the shift lever is pivoted with the U-shaped holder by means of the pivot pins respectively extending through the pivot hole of the shift lever.

5. The fixture assembly as claimed in claim 1, wherein the U-shaped holder has a clasp formed on an upper end thereof corresponding to a cut defined in the thumb grip end of the shift lever.

6. The fixture assembly as claimed in claim 1, with the at least first fixing unit further having a second pair of hooks and being in the form of a framework.

7. The fixture assembly as claimed in claim 6, wherein the heat sink has a plurality of fins integrally formed on a conducting plate, with the heat sink having two flanges formed at two opposite sides thereof, each flange having two pivot barrels respectively formed at two opposite ends thereof corresponding to two slots respectively defined at two opposite sides of the U-shaped holder, with the U-shaped holder being pivotally connected to the heat sink by the two pivot barrels being received in the two slots, and each flange having a recess defined in a bottom thereof to correspond to the holding pawls of the U-shaped holder.

8. The fixture assembly as claimed in claim 6, wherein the fixing unit has two pairs of fixing legs extending downward from a bottom thereof corresponding to fixing holes defined in the main board at the opposite sides of the CPU, each fixing leg having a retaining ring formed therearound.

9. The fixture assembly as claimed in claim 6, wherein the U-shaped holder has two pivot pins formed at two opposite sides of a middle portion thereof corresponding to a pivot hole defined in a middle of the shift lever between the pressing end and the thumb grip end of the shift lever, the pressing end of the shift lever being defined with a gap to receive the middle portion of the U-shaped holder fitted therein, whereby the shift lever is pivoted with the U-shaped holder by means of the pivot pins respectively extending through the pivot hole of the shift lever.

10. The fixture assembly as claimed in claim 6, wherein the U-shaped holder has a clasp formed on an upper end thereof corresponding to a cut defined in the thumb grip end of the shift lever.

11. The fixture assembly as claimed in claim 1, further comprising a second fixing unit.

12. The fixture assembly as claimed in claim 11, wherein the heat sink has a plurality of fins integrally formed on a conducting plate, with the heat sink having two flanges formed at two opposite sides thereof, each flange having two pivot barrels respectively formed at two opposite ends thereof corresponding to two slots respectively defined at two opposite sides of the U-shaped holder, with the U-shaped holder being pivotally connected to the heat sink by the two pivot barrels being received in the two slots, and each flange having a recess defined in a bottom thereof to correspond to the holding pawls of the U-shaped holder.

13. The fixture assembly as claimed in claim 11, wherein each fixing unit has a first pair of fixing legs extending downward from a bottom thereof corresponding to fixing holes defined in the main board at the opposite sides of the CPU, each fixing leg having a retaining ring formed therearound.

14. The fixture assembly as claimed in claim 11, wherein the U-shaped holder has two pivot pins formed at two opposite sides of a middle portion thereof corresponding to a pivot hole defined in a middle of the shift lever between the pressing end and the thumb grip end of the shift lever, the pressing end of the shift lever being defined with a gap to receive the middle portion of the U-shaped holder fitted therein, whereby the shift lever is pivoted with the U-shaped holder by means of the pivot pins respectively extending through the pivot hole of the shift lever.

15. The fixture assembly as claimed in claim 11, wherein the U-shaped holder has a clasp formed on an upper end thereof corresponding to a cut defined in the thumb grip end of the shift lever.

16. A fixture assembly comprising:

at least a first fixing unit adapted to be mounted on a main board and having at least a first pair of hooks formed at two opposite ends thereof; and a hold-down unit for each pair of hooks, with each hold-down unit having a U-shaped holder adapted to be pivotally connected at two opposite sides of a heat sink, with the U-shaped holder having two lower ends formed with two holding pawls corresponding to the pair of hooks of the at least first fixing unit; and with each hold-down unit having a shift lever connected with the U-shaped holder and pivotal in a direction perpendicular to a pivotal direction of the U-shaped holder, with the shift lever having a pressing end and a thumb grip end;

whereby when the holding pawls of the U-shaped holder catch with the pair of hooks of the at least first fixing unit, and the shift lever is turned to a locking position where the pressing end of the shift lever is pressed against the heat sink so as to force the heat sink to abut tightly against a CPU mounted on the main board.

17. The fixture assembly as claimed in claim 16, wherein the at least first fixing unit has at least a first pair of fixing legs extending downward from a bottom thereof corresponding to fixing holes defined in the main board at the opposite sides of the CPU, each fixing leg having a retaining ring formed therearound.

18. The fixture assembly as claimed in claim 16, wherein the U-shaped holder has two pivot pins formed at two opposite sides of a middle portion thereof corresponding to a pivot hole defined in a middle of the shift lever between the pressing end and the thumb grip end of the shift lever, the pressing end of the shift lever being defined with a gap to receive the middle portion of the U-shaped holder fitted therein, whereby the shift lever is pivoted with the U-shaped holder by means of the pivot pins respectively extending through the pivot hole of the shift lever.

19. The fixture assembly as claimed in claim 16, wherein the U-shaped holder has a clasp formed on an upper end thereof corresponding to a cut defined in the thumb grip end of the shift lever.

20. The fixture assembly as claimed in claim 4, wherein the U-shaped holder has a clasp formed on an upper end thereof corresponding to a cut defined in the thumb grip end of the shift lever.

\* \* \* \* \*